United States Patent
Miller

(10) Patent No.: US 7,065,111 B2
(45) Date of Patent: *Jun. 20, 2006

(54) METHOD FOR TESTING LASER USING SIDE MODE SUPPRESSION RATIO

(75) Inventor: Charles W. Miller, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 56 days.

This patent is subject to a terminal disclaimer.

(21) Appl. No.: 10/823,843

(22) Filed: Apr. 14, 2004

(65) Prior Publication Data

US 2004/0190568 A1 Sep. 30, 2004

Related U.S. Application Data

(63) Continuation of application No. 10/246,038, filed on Sep. 18, 2002, now Pat. No. 6,778,566.

(51) Int. Cl.
*H01S 3/13* (2006.01)

(52) U.S. Cl. ............... 372/29.014; 372/29.016

(58) Field of Classification Search .......... 372/29.014
See application file for complete search history.

(56) References Cited

U.S. PATENT DOCUMENTS

| 5,712,715 A * | 1/1998 | Erdogan et al. ............... 359/8 |
| 5,812,572 A * | 9/1998 | King et al. ............... 372/38.04 |
| 6,778,566 B1 * | 8/2004 | Miller ................... 372/29.014 |

* cited by examiner

*Primary Examiner*—Minsun Oh Harvey
*Assistant Examiner*—Dung Nguyen
(74) *Attorney, Agent, or Firm*—Workman Nydegger

(57) ABSTRACT

Systems, methods and computer software are provided for testing a laser. Initially, the laser is operated at a first bias setting and a data rate of about 10 Gb/s, and a first side mode suppression ratio of the laser output is measured that is based on a first ratio of a highest and next highest optical power peaks as a function of a first wavelength. Next, the laser is operated at a second bias setting and a data rate of about 10 Gb/s, and a second side mode suppression ratio of the laser output is measured that is based on a second ratio of a highest and next highest optical power peaks as a function of a second wavelength. A test result for the laser is then generated in accordance with a difference between the first and second side mode suppression ratios.

45 Claims, 5 Drawing Sheets

METHOD FOR TESTING LASER USING SIDE MODE SUPPRESSION RATIO

CROSS-REFERENCE TO RELATED APPLICATIONS

This application is a continuation, and claims the benefit, of U.S. patent application Ser. No. 10/246,038, issued as U.S. Pat. No. 6,778,566, entitled SYSTEM AND METHOD FOR TESTING A LASER MODULE BY MEASURING ITS SIDE MODE SUPPRESSION RATIO, filed Sep. 18, 2002, and incorporated herein in its entirety by this reference.

BACKGROUND OF THE INVENTION

Field of the Invention

This invention generally relates to the testing of optoelectronic components such as lasers. More particularly, embodiments of the invention are concerned with systems and methods for testing and evaluating lasers having data rates at least as high as 10 Gb/s.

BRIEF SUMMARY OF AN EXEMPLARY EMBODIMENT OF THE INVENTION

Systems and methods are provided for use in testing and evaluating lasers. In one exemplary embodiment of the invention, the method involves measuring first and second side mode suppression ratios associated with a particular laser module or transmitter. A correlation of the change in side mode suppression ratio to a measured bit error rate is then used as a basis for determining the suitability of the laser under test for use in a particular application, or applications. Because the change in side mode suppression ratio is closely correlated with bit error rate, this method provides a relatively quick and reliable way to evaluate laser performance. Moreover, the method is useful in testing and evaluating lasers having a wide range of data rates, including lasers with data rates as high as 10 Gb/s.

DETAILED DESCRIPTION OF THE PREFERRED EMBODIMENTS

Figure 1:
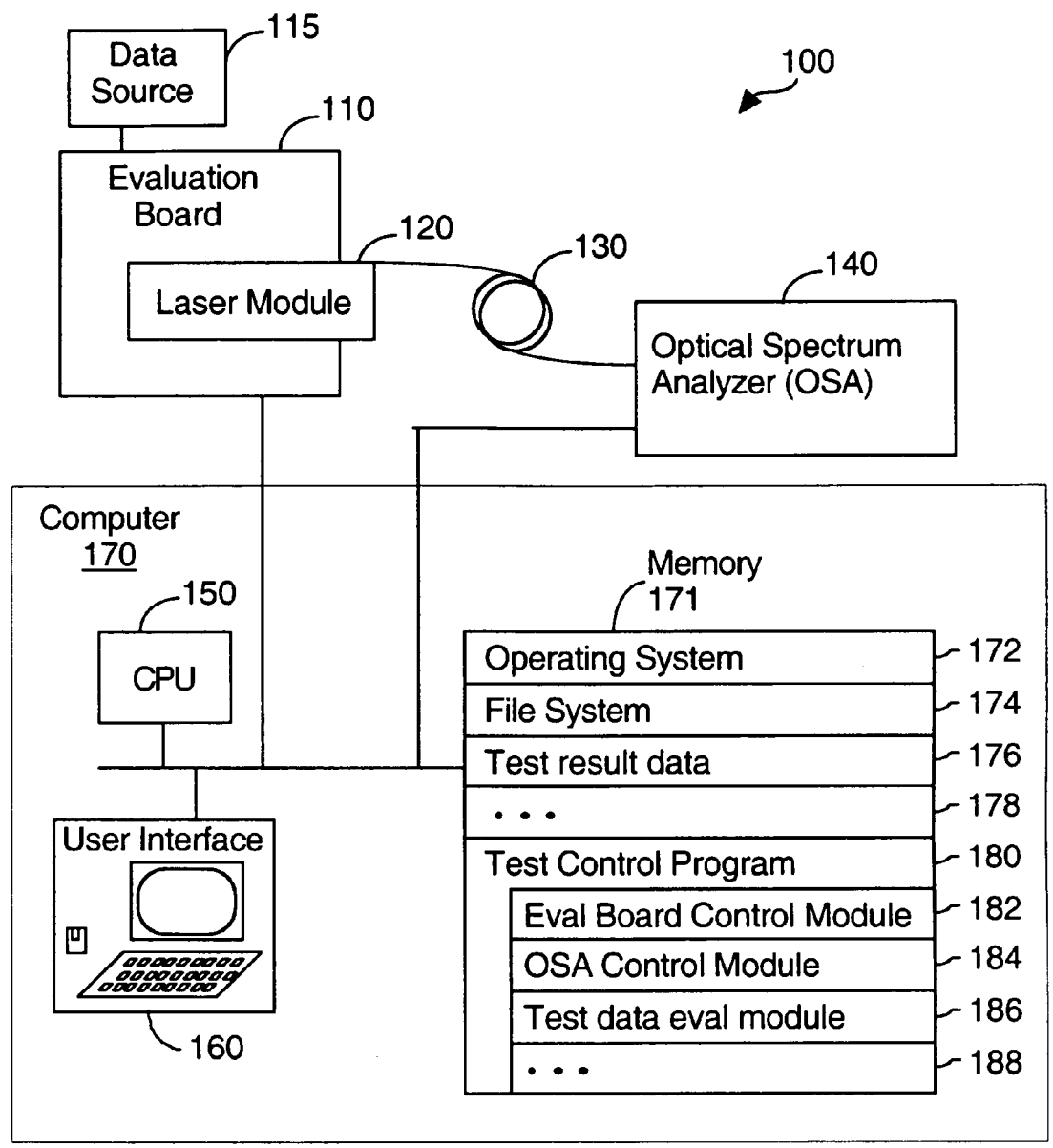
FIG. 1 is a schematic diagram of a preferred embodiment of the apparatus according to the present invention.

The structure and function of the preferred embodiments can best be understood by reference to the drawings. Where the same reference numerals appear in multiple figures, the numerals refer to the same or corresponding structure in those figures.

As shown in FIG. 1, in a laser module testing system 100, a laser module 120 is capable of being mounted to and operated by evaluation board 110. Laser module 120 may include a distributed feedback (DFB) laser with a threshold current level. Evaluation board 110 supplies power to laser module 120, including AC and DC current. Data source 115 supplies a modulated electrical data stream signal to evaluation board 110. Data source 115 can be, for example, a commercially available bit error rate transmitter (BERT) or a low cost circuit (typically mounted on a printed circuit board) specifically designed for such purpose. Data source 115 should be capable of delivering data stream signals that are similar to the data streams that will be encountered by laser module 120 in actual field use. Evaluation board 110 transmits the electrical data stream signal from data source 115 to laser module 120. Laser module 120 converts the electrical signal into an optical signal output. Output from the laser module is directed to a testing device 140 capable of measuring optical output of the laser module with respect to wavelength. In the preferred embodiment, testing device 140 is an optical spectrum analyzer (OSA). Output from laser module 120 is directed to testing device 140 through a length of optical fiber 130. Evaluation board 110 and testing device 140 are coupled to CPU 150, user interface 160, and memory 171. Memory 171 may include high speed random access memory and non-volatile memory such as disk storage. Memory 171 stores, inter alia, operating system 172, file system 174, test result data 176, test control program 180, evaluation board control module 182, OSA control module 184 and test data evaluation module 188. More generally, memory 171 stores control software for execution by the CPU 150 of computer 170, where the control software is capable of evaluating the laser module 120 by controlling function of the laser module 120, testing device 140 and evaluation board 110 in order to perform all steps of the method of the present invention.

Figure 2:
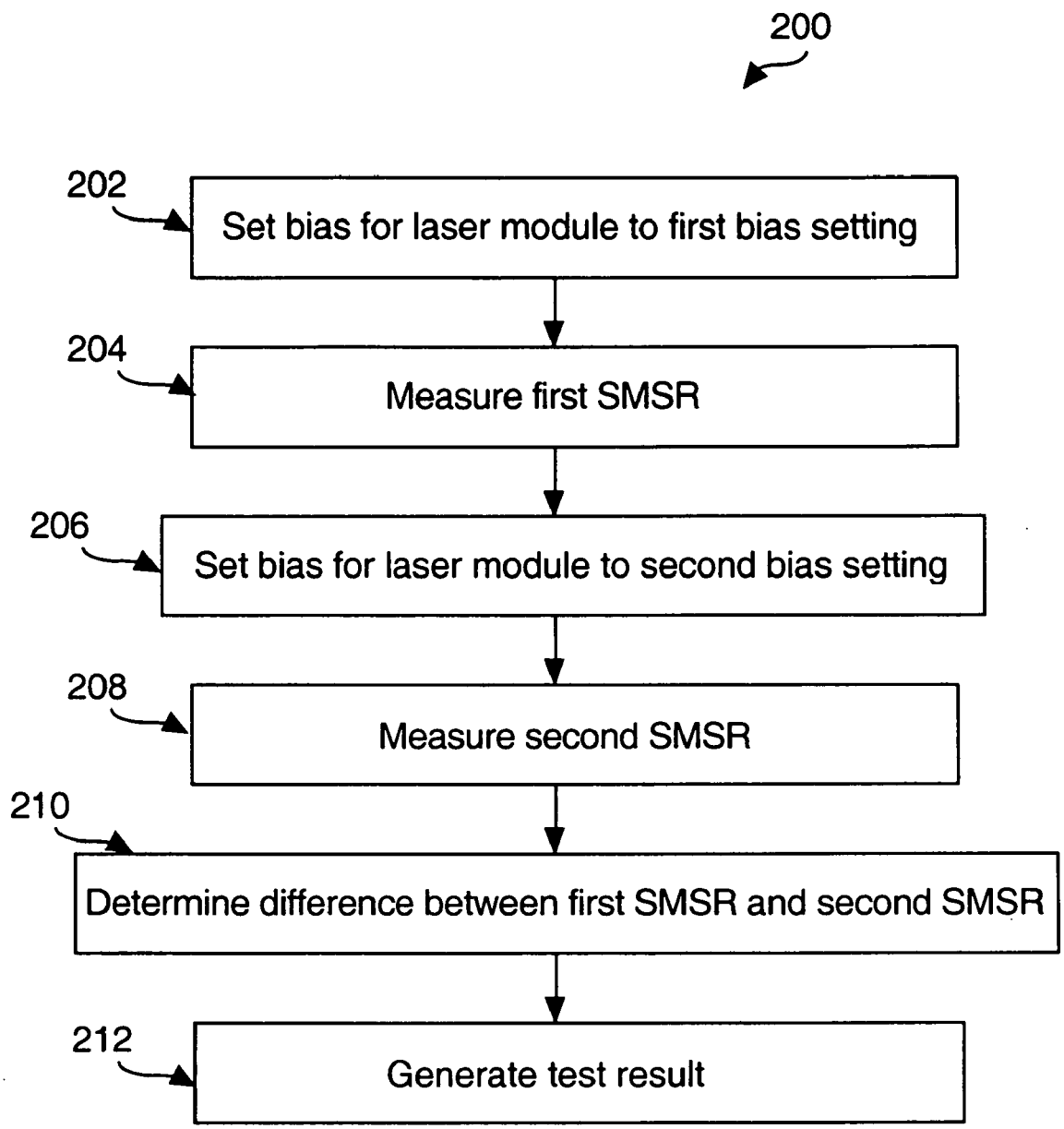
FIG. 2 is a flow chart depicting a method of the present invention.

FIG. 2 shows a method 200 of the present invention. During step 202, laser module 120 is set at a first bias setting, including associated AC and DC current level settings. Further, data is provided to and transmitted by the laser module during at least the measurement steps 204, 208 of the method. Preferably, the data transmission rate of the laser module during the testing is similar to the data rate to be used during normal operation of the laser diode, e.g., a data rate in the range of 1 Gb/s to 10 Gb/s.

During step 204, a first side mode suppression ratio is measured from output from laser module 120 while the laser module is operated at the first bias setting. During step 206, laser module 120 is set at a second bias setting, including associated AC and DC current level settings. One may predetermine which of the first or second bias settings will comprise a lower DC current level voltage than the other bias setting. In the preferred embodiment, the first bias setting includes the DC and AC currents suitable for field operation of laser module 120, and the second bias setting includes a DC current level that is approximately 5 mA lower than the first bias setting. More generally, the difference between the DC current of the first and second settings is less than 15 mA, and preferably is 5 mA or less. During step 208, a second side mode suppression ratio is measured from output from laser module 120 while the laser module is operated at the second bias setting. During step 210, a difference between the first and second side mode suppression ratio measurements is determined, and then in step 212 a test result is generated for laser module 120 in accordance with that difference. In accordance with the test result, one may evaluate the suitability of laser module 120 for such uses as long haul data communication through optical fiber.

In a preferred embodiment, the first and second side mode suppression ratios are computed using logarithmic (e.g., decibel) units, for example:

$$SMSR = 10 \, Log_{10}(Peak1/Peak2)$$

(where Peak1 and Peak2 represent the highest and second highest optical power peaks as a function of wavelength). As a result, the difference between the first and second side mode suppression ratios, ΔSMSR, represents a percentage change in the side mode suppression ratio between the first and second bias settings, as opposed to an absolute change in the side mode suppression ratio. In other embodiments, absolute measurement units, or other suitable units may be used to represent the first and second side mode suppression ratios and the difference therebetween.

In the preferred embodiment, evaluation board 110 supplies both a data stream received from data source 115 and AC and DC current to laser module 120 in accordance with instructions from control software executed by computer 170. Further, in the preferred embodiment, testing device 140 measures the side mode suppression ratios at each of the first and second bias settings and generates the test result in accordance with the difference between the first and second side mode suppression ratio measurements.

In alternate embodiments of the present invention, the division of tasks performed during method 200 may be different from that described above. For example, some of the tasks performed by the testing device 140 in the preferred embodiment may be performed by the computer 170 of the evaluation board 110, and some or all of the tasks performed by the computer 170 in the preferred embodiment may be performed by a processor on the evaluation board 110 or by another device. In one particular alternate embodiment of the present invention, computer 170 is coupled to evaluation board 110 and testing device 140, and utilizes control software to determine the first and second side mode suppression ratios and to evaluate the laser module. It does this by sending first control signals to evaluation board 110 to operate laser module 120 at a first bias setting, receiving first information from testing device 140 associated with operation of laser module 120 at the first bias setting and using the first information to determine a first side mode suppression ratio of the laser module output while operating the laser module at the first bias setting. The computer 170 continues evaluating the laser module by sending second control signals to evaluation board 110 to operate laser module 120 at a second bias setting, receiving second information from testing device 140 associated with operation of the laser module at the second bias setting and using the second information to determine a second side mode suppression ratio of the laser module output while operating the laser module at the second bias setting.

In the alternate embodiment being described, the computer 170 generates a test result for laser module 120 in accordance with a difference between the first and second side mode suppression ratio measurements. In this alternate embodiment, the testing device 140 generates the first information and second information in the form of optical power output measurements at multiple wavelengths. The computer 170 uses these measurements to determine highest and second highest peaks of the output optical power as a function of wavelength. From the highest and second highest peaks in the first information the computer computes the first side mode suppression ratio, and from the highest and second highest peaks in the second information the computer computes the second side mode suppression ratio.

Figure 3:
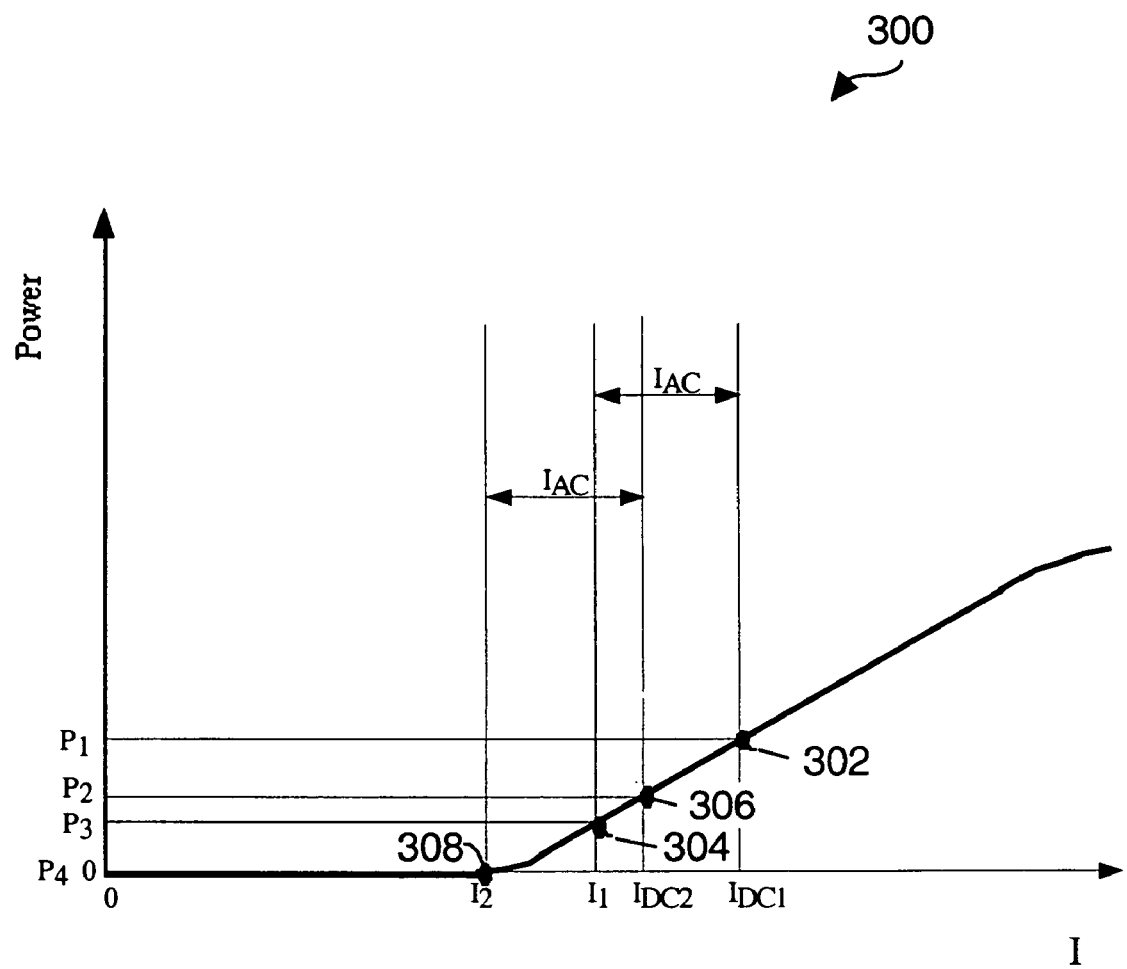
FIG. 3 is a graph of the relationship between power and current supplied to a laser module.

Referring to FIG. 3, graph 300 shows a relationship between power and current supplied to laser module 120 during steps 202, 204, 206 and 208, which can be used to depict the key features of the levels of AC and DC current supplied to laser module 120 in conjunction with first and second bias settings. Levels of AC and DC current supplied to laser module 120 at a first bias setting can be determined by increasing a DC current supplied to laser module 120 until a desired optical power output is achieved (as represented by DC operating point 302), and then varying an AC current supplied to the laser module until a desired extinction ratio is achieved. At the first bias setting, the laser module has an operating range represented by operating points 302 and 304 in FIG. 3. A second bias setting can be determined by increasing or decreasing a DC current supplied to laser module 120 (306) while maintaining an AC current to the laser module that is substantially equal to the AC current level of the first bias setting. At the second bias setting, the laser module has an operating range represented by operating points 306 and 308. The first or second bias setting having the lower DC current level causes laser module 120 to operate at a range of current levels that is at least partially below the laser module's threshold current level. This "below threshold" mode of operation is represented by point 308 in FIG. 3.

Figure 4:
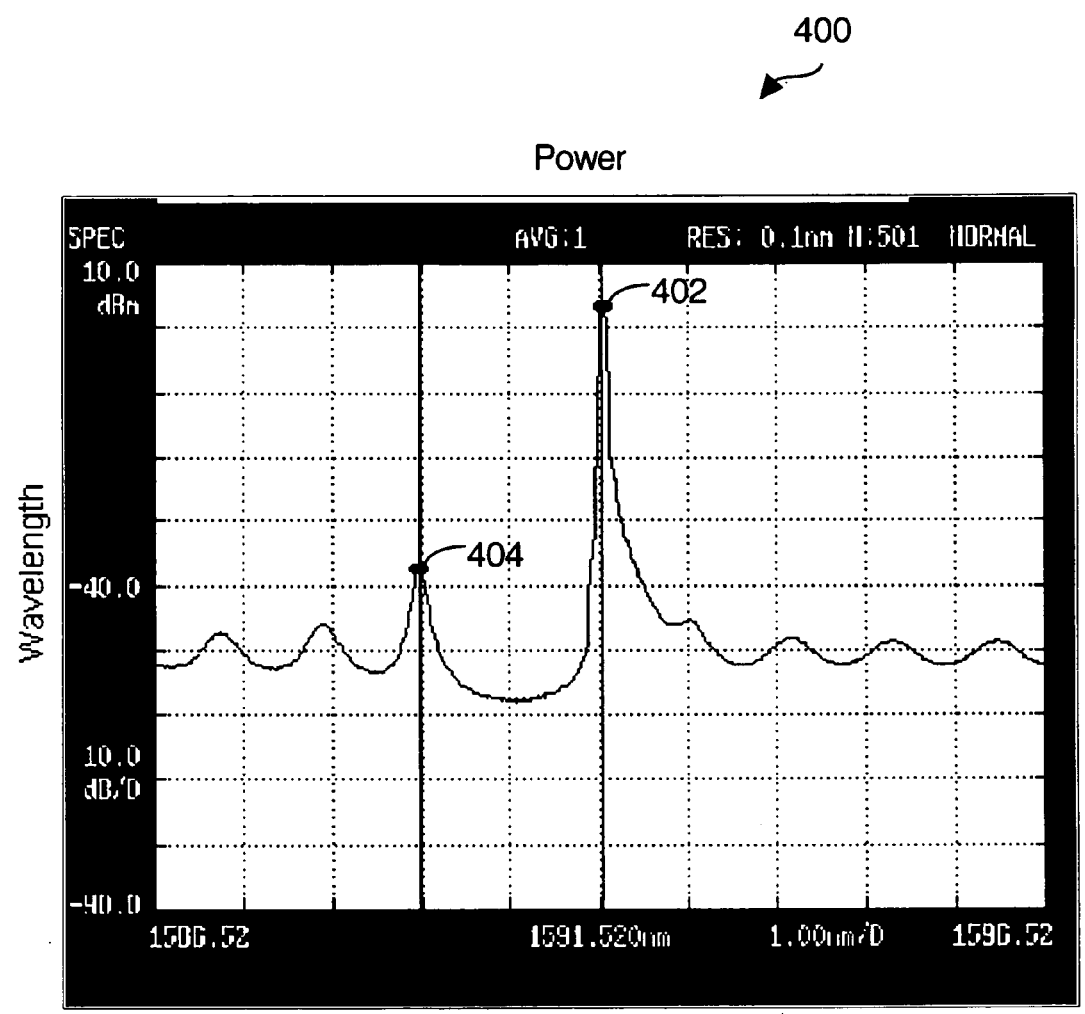
FIG. 4 is a graph of the relationship between power and wavelength for an exemplary typical laser module.

Referring to FIG. 4, graph 400 shows a relationship between wavelength and optical output power for laser module 120 while the laser module is operated at either a first or second bias setting. Wavelength peaks generated by plotting wavelength vs. power are used to measure a side mode suppression ratio of laser module 120 at each of the first and second bias settings. In the preferred embodiment, the data contained in graph 400 is generated by testing device 140 based on output from laser module 120 received through optical fiber 130. A side mode suppression ratio measurement for the laser module operating at a given bias setting is measured by computing the ratio of the power values at the highest wavelength peak (402) and second highest wavelength peak (404). If the power values are measured in decibel units, as is the case in the preferred embodiment, this ratio is computed by subtracting the second highest power value from the highest power value. In the preferred embodiment, testing device 140 performs this calculation. In alternate embodiments, a side mode suppression ratio can be calculated by computer 170 or manually by a user, using power vs. wavelength data generated by testing device 140.

Figure 5:
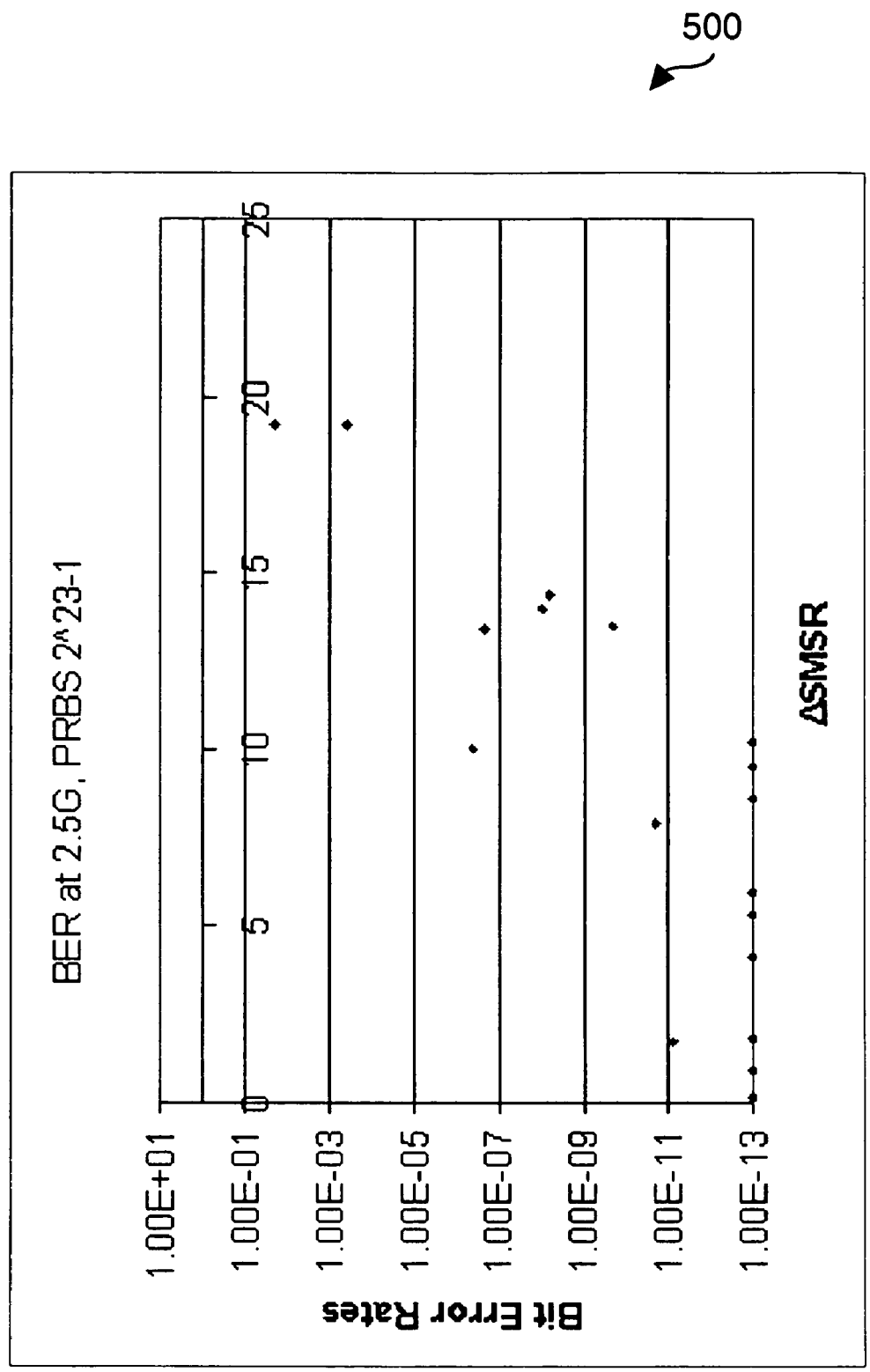
FIG. 5 is a graph of the relationship between bit error rates and ΔSMSR.

Referring to FIG. 5, graph 500 shows the relationship between actual bit error rates measured for several laser modules 120 and ΔSMSR (the difference between first and second side mode suppression ratio measurements) for those laser modules in accordance with the method of the present invention. Graph 500 demonstrates that a ΔSMSR measurement below approximately ten decibels (10 db) is indicative of an actual bit error rate on the order of $1 \times 10^{-13}$ for the laser module. In the preferred embodiment, a ΔSMSR measurement of less than five decibels (5 db) is considered sufficiently reliable to deem a laser module suitable for such uses as long haul data communication through optical fiber at the full data rate for which the laser module has been designed, for which the typical acceptable error rate is on the order of one error in one trillion bits (or $1 \times 10^{-12}$). Laser modules whose ΔSMSR is above 5 db may not, in some circumstances, be considered suitable for such uses, and are labeled for use at lower data transmission rates (e.g., 1 Gb/s instead of 2.5 Gb/s, or 2.5 Gb/s instead of 5 Gb/s) than the laser modules whose ΔSMSR is below 5 db, and/or for shorter transmission lengths than the laser modules whose ΔSMSR is below 5 db. In alternate embodiments, a ΔSMSR other than 5 db may be used as the threshold to determine the laser's suitability for a particular use.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method for testing a laser, comprising:
   operating the laser at a first bias setting, the laser having a data rate at the first bias setting of about 10 Gb/s;
   measuring a first side mode suppression ratio of the laser output based on a first ratio of highest and next highest optical power peaks as a function of a first wavelength while operating the laser at the first bias setting and at a data rate of about 10 Gb/s;
   operating the laser at a second bias setting, the laser having a data rate at the second bias setting of about 10 Gb/s;
   measuring a second side mode suppression ratio of the laser output based on a second ratio of highest and next highest optical power peaks as a function of a second wavelength while operating the laser at the second bias setting and at a data rate of about 10 Gb/s; and
   generating a test result for the laser in accordance with a difference between the first and second side mode suppression ratios.

2. The method as recited in claim 1, wherein at least one of the first and second bias settings causes the laser to operate substantially within a range of current levels that is at least partially below a threshold current level of the laser.

3. The method as recited in claim 1, wherein each side mode suppression ratio is computed using the following formula:

$$\text{Side Mode Suppression Ratio} = 10 \, \text{Log}_{10}(\text{Peak1}/\text{Peak2}),$$

where,
   Peak1=a value of a highest optical power peak, and
   Peak2=a value of a second highest optical power peak.

4. The method as recited in claim 1, wherein one of the first and second bias settings comprises a lower DC current level voltage than the other of the first and second bias settings.

5. The method as recited in claim 1, wherein levels of AC and DC current supplied to the laser at the first bias setting are determined by:
   adjusting the DC current supplied to the laser until a desired optical output is achieved; and
   adjusting the AC current supplied to the laser until a desired extinction ratio is achieved.

6. The method as recited in claim 5, wherein the AC current is adjusted subsequent to adjustment of the DC current.

7. The method as recited in claim 1, wherein levels of AC and DC current supplied to the laser at the second bias setting are determined by:
   adjusting a DC current supplied to the laser until the DC current achieves a predetermined relationship relative to the DC current that was supplied to the laser at the first bias setting; and
   substantially maintaining an AC current supplied to the laser at the first bias setting.

8. The method as recited in claim 1, further comprising using the test result in evaluating suitability of the laser for a particular application.

9. A method for testing a laser, comprising:
   operating the laser at a first bias setting;
   measuring a first side mode suppression ratio of the laser output based on a first ratio of highest and next highest optical power peaks as a function of a first wavelength while operating the laser at the first bias setting;
   operating the laser at a second bias setting;
   measuring a second side mode suppression ratio of the laser output based on a second ratio of highest and next highest optical power peaks as a function of a second wavelength while operating the laser at the second bias setting;
   correlating a difference between the first and second side mode suppression ratios with a measured bit error rate; and
   determining a value of an operational parameter for the laser based upon the correlation between the suppression ratio difference and measured bit error rate.

10. The method as recited in claim 9, wherein the operational parameter comprises at least one of: a data rate associated with the laser; and, a transmission length associated with the laser.

11. The method as recited in claim 9, wherein the measured bit error rate is a bit error rate associated with the laser.

12. The method as recited in claim 9, wherein the laser is operated at a data rate of about 10 Gb/s during at least a portion of the test.

13. The method as recited in claim 9, wherein at least one of the first and second bias settings causes the laser to operate substantially within a range of current levels that is at least partially below a threshold current level of the laser.

14. The method as recited in claim 9, wherein one of the first and second bias settings comprises a lower DC current level voltage than the other of the first and second bias settings.

15. The method as recited in claim 9, wherein levels of AC and DC current supplied to the laser at the first bias setting are determined by:
   adjusting the DC current supplied to the laser until a desired optical output is achieved; and
   adjusting the AC current supplied to the laser until a desired extinction ratio is achieved.

16. The method as recited in claim 9, wherein levels of AC and DC current supplied to the laser at the second bias setting are determined by:
   adjusting a DC current supplied to the laser until the DC current achieves a predetermined relationship relative to the DC current that was supplied to the laser at the first bias setting; and
   substantially maintaining an AC current supplied to the laser at the first bias setting.

17. The method as recited in claim 16, wherein the predetermined relationship comprises one of: the DC current supplied to the laser at the second bias setting is greater than the DC current supplied to the laser at the first bias setting; and, the DC current supplied to the laser at the second bias setting is less than the DC current supplied to the laser at the first bias setting.

18. A computer program product for implementing a method for testing a laser, the computer program product comprising:
   a computer readable medium carrying computer executable instructions for performing the method, wherein the method comprises:

causing operation of the laser at a first bias setting, the laser having a data rate at the first bias setting of about 10 Gb/s;

measuring a first side mode suppression ratio of a laser output based on a first ratio of highest and next highest optical power peaks as a function of a first wavelength while operating the laser at the first bias setting and at a data rate of about 10 Gb/s;

causing operation of the laser at a second bias setting, the laser having a data rate at the second bias setting of about 10 Gb/s;

measuring a second side mode suppression ratio of a laser output based on a second ratio of highest and next highest optical power peaks as a function of a second wavelength while operating the laser at the second bias setting and at a data rate of about 10 Gb/s; and generating a test result for the laser in accordance with a difference between the first and second side mode suppression ratios.

19. The computer program product as recited in claim 18, wherein causing operation of the laser at a first bias setting comprises transmitting at least one control signal that causes operation of the laser at the first bias setting.

20. The computer program product as recited in claim 18, wherein causing operation of the laser at a second bias setting comprises transmitting at least one control signal that causes operation of the laser at the second bias setting.

21. The computer program product as recited in claim 18, wherein at least one of the first and second bias settings causes the laser to operate substantially within a range of current levels that is at least partially below a threshold current level of the laser.

22. The computer program product as recited in claim 18, wherein one of the first and second bias settings comprises a lower DC current level voltage than the other of the first and second bias settings.

23. The computer program product as recited in claim 18, wherein levels of AC and DC current supplied to the laser at the first bias setting are determined by:

adjusting the DC current supplied to the laser until a desired optical output is achieved; and adjusting the AC current supplied to the laser until a desired extinction ratio is achieved.

24. The computer program product as recited in claim 18, wherein each side mode suppression ratio is computed using the following formula:

Side Mode Suppression Ratio=10 $\text{Log}_{10}$(Peak1/Peak2), where,

Peak1=a value of a highest optical power peak, and

Peak2=a value of a second highest optical power peak.

25. The computer program product as recited in claim 18, wherein levels of AC and DC current supplied to the laser at the second bias setting are determined by:

adjusting a DC current supplied to the laser until the DC current achieves a predetermined relationship relative to the DC current that was supplied to the laser at the first bias setting; and substantially maintaining an AC current supplied to the laser at the first bias setting.

26. The computer program product as recited in claim 18, further comprising using the test result as a basis for identifying an optimal data rate for the laser.

27. The computer program product as recited in claim 26, wherein the optimal data rate corresponds to a permissible bit error rate.

28. A computer program product for implementing a method for testing a laser, the computer program product comprising:

a computer readable medium carrying computer executable instructions for performing the method, wherein the method comprises:

causing operation of the laser at a first bias setting;

measuring a first side mode suppression ratio of a laser output based on a first ratio of highest and next highest optical power peaks as a function of a first wavelength while operating the laser at the first bias setting;

causing operation of the laser at a second bias setting;

measuring a second side mode suppression ratio of a laser output based on a second ratio of highest and next highest optical power peaks as a function of a second wavelength while operating the laser at the second bias setting;

correlating a difference between the first and second side mode suppression ratios with a measured bit error rate; and determining a value of an operational parameter for the laser based upon the correlation between the suppression ratio difference and measured bit error rate.

29. The computer program product as recited in claim 28, wherein the operational parameter comprises at least one of: a data rate associated with the laser; and, a transmission length associated with the laser.

30. The computer program product as recited in claim 28, wherein causing operation of the laser at a first bias setting comprises transmitting at least one control signal that causes operation of the laser at the first bias setting.

31. The computer program product as recited in claim 28, wherein causing operation of the laser at a second bias setting comprises transmitting at least one control signal that causes operation of the laser at the second bias setting.

32. The computer program product as recited in claim 28, wherein the measured bit error rate is a bit error rate associated with the laser.

33. The computer program product as recited in claim 28, wherein the laser is operated at a data rate of about 10 Gb/s during at least a portion of the test.

34. The computer program product as recited in claim 28, wherein at least one of the first and second bias settings causes the laser to operate substantially within a range of current levels that is at least partially below a threshold current level of the laser.

35. The computer program product as recited in claim 28, wherein one of the first and second bias settings comprises a lower DC current level voltage than the other of the first and second bias settings.

36. The computer program product as recited in claim 28, wherein levels of AC and DC current supplied to the laser at the first bias setting are determined by:

adjusting the DC current supplied to the laser until a desired optical output is achieved; and adjusting the AC current supplied to the laser until a desired extinction ratio is achieved.

37. The computer program product as recited in claim 28, wherein levels of AC and DC current supplied to the laser at the second bias setting are determined by:
- adjusting a DC current supplied to the laser until the DC current achieves a predetermined relationship relative to the DC current that was supplied to the laser at the first bias setting; and
- substantially maintaining an AC current supplied to the laser at the first bias setting.

38. A system for testing a laser, comprising:
- a data source configured to transmit a data stream signal;
- an evaluation board configured to receive the data stream signal from the data source and to transmit the received data stream signal to the laser;
- a test device configured to measure optical output of the laser with respect to wavelength; and
- a computer coupled to the evaluation board and the test device, the computer including control software comprising one or more modules for testing the laser by:
  - causing the evaluation board to operate the laser at a first bias setting;
  - receiving, from the test device, information associated with operation of the laser at the first bias setting, and using the received information to determine a first side mode suppression ratio of the laser output based on a first ratio of highest to next highest optical power peaks as a function of a first wavelength;
  - causing the evaluation board to operate the laser at a second bias setting;
  - receiving, from the test device, information associated with operation of the laser at the second bias setting, and using the received information associated with the second bias setting to determine a second side mode suppression ratio of the laser output based on a second ratio of highest to next highest optical power peaks as a function of a second wavelength; and
  - generating a test result for the laser in accordance with a difference between the first and second side mode suppression ratios.

39. The system as recited in claim 38, wherein a data stream signal transmitted to the laser has an associated data rate of about 10 Gb/s.

40. The system as recited in claim 38, wherein causing operation of the laser at a first bias setting comprises transmitting at least one control signal that causes operation of the laser at the first bias setting.

41. The system as recited in claim 38, wherein causing operation of the laser at a second bias setting comprises transmitting at least one control signal that causes operation of the laser at the second bias setting.

42. The system as recited in claim 38, wherein the test device is configured to communicate with the laser by way of an optical fiber.

43. The system as recited in claim 38, wherein the laser is configured to, at least indirectly, physically and electrically interface with the evaluation board.

44. The system as recited in claim 38, wherein the test device comprises an optical spectrum analyzer.

45. The system as recited in claim 38, wherein the control software of the computer comprises:
- an evaluation board control module;
- an optical spectrum analyzer control module; and
- a test data evaluation module.

* * * * *

UNITED STATES PATENT AND TRADEMARK OFFICE
CERTIFICATE OF CORRECTION

PATENT NO. : 7,065,111 B2  Page 1 of 1
APPLICATION NO. : 10/823843
DATED : June 20, 2006
INVENTOR(S) : Miller It is certified that error appears in the above-identified patent and that said Letters Patent is hereby corrected as shown below:

Column 2
Line 27, change "188" to --186--

Signed and Sealed this

Thirteenth Day of July, 2010

David J. Kappos
*Director of the United States Patent and Trademark Office*